United States Patent
Wang et al.

(10) Patent No.: US 12,238,873 B2
(45) Date of Patent: Feb. 25, 2025

(54) INTELLIGENT ELECTRONIC DEVICE WITH A DETACHABLE DISPLAY MODULE

(71) Applicant: Accuenergy (Canada) Inc., Toronto (CA)

(72) Inventors: Yufan Wang, Toronto (CA); Shaohang Cui, Toronto (CA); Ketao Li, Toronto (CA); Yan Ding, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 372 days.

(21) Appl. No.: 17/835,483

(22) Filed: Jun. 8, 2022

(65) Prior Publication Data

US 2023/0403800 A1  Dec. 14, 2023

(51) Int. Cl.
*H05K 5/00* (2006.01)
*G06F 1/16* (2006.01)

(52) U.S. Cl.
CPC ......... *H05K 5/0017* (2013.01); *G06F 1/1601* (2013.01)

(58) Field of Classification Search
CPC ...... H05K 7/12; H05K 7/1474; H05K 5/0017; H02B 1/052
See application file for complete search history.

(56) References Cited

U.S. PATENT DOCUMENTS

| | | | |
|---|---|---|---|
| 6,278,605 B1 * | 8/2001 | Hill | H02B 1/26 361/600 |
| 6,563,697 B1 * | 5/2003 | Simbeck | H02B 1/052 403/325 |
| 9,303,811 B1 * | 4/2016 | Lutz, Jr. | H05K 7/1474 |
| 9,632,112 B2 * | 4/2017 | Harding | G01R 11/04 |
| 10,798,842 B1 * | 10/2020 | Wen | H05K 7/1405 |
| 12,035,509 B2 * | 7/2024 | Best | H05K 7/20163 |
| 2008/0146055 A1 * | 6/2008 | Eckardt | H02B 1/052 439/110 |
| 2010/0314522 A1 * | 12/2010 | Molnar | H02B 1/052 248/346.06 |

(Continued)

OTHER PUBLICATIONS

Acuvim II Advanced Power and Energy Meter Datasheet. Revision Date: Mar. 2022 Version: 1.0.2. Retrieved Jul. 12, 2022 from https://accucdn.accuenergy.com/wp-content/uploads/Acuvim-II-Advanced-Power-and-Energy-Meter-Datasheet.pdf.

(Continued)

*Primary Examiner* — Sagar Shrestha
(74) *Attorney, Agent, or Firm* — Dhiraj Jindal; PATENT YOGI LLC

(57) ABSTRACT

An intelligent electronic device that can be optionally connected to a DIN rail or a display module without requiring the use of tools. An intelligent electronic device for measuring a characteristic of electricity is provided, which is enclosed in a housing that has a front and a rear. The housing defines an interior volume and includes a sensor configured to sense a characteristic of electricity. The rear of the housing includes a first protuberance structure disposed on a first outer surface. The first protuberance structure contains elongate protrusions and at least one hexagonal protrusion on a second outer surface. The elongate protrusions include upper protrusions and lower protrusions. The lower protrusions include left protrusions and right protrusions, and the at least one hexagonal protrusion is disposed between the left protrusions and right protrusions.

22 Claims, 7 Drawing Sheets

(56) References Cited

U.S. PATENT DOCUMENTS

| | | | | |
|---|---|---|---|---|
| 2015/0241480 | A1* | 8/2015 | Harding | G01R 22/065 |
| | | | | 324/156 |
| 2016/0295733 | A1* | 10/2016 | Chiang | H02B 1/0523 |
| 2017/0311462 | A1* | 10/2017 | Kamensek | H01H 85/54 |
| 2019/0123520 | A1* | 4/2019 | Azuma | H02B 1/0523 |
| 2022/0051864 | A1* | 2/2022 | Daoura | H01R 13/7135 |
| 2022/0279672 | A1* | 9/2022 | Huang | H05K 7/1474 |

OTHER PUBLICATIONS

Acuvim II Power Meter User's Manual. V:1.0 Revised Oct. 2018. Retrieved Jul. 12, 2022 from https://accucdn.accuenergy.com/wp-content/uploads/Acuvim-II-Power-Meter-User-Manual-1040E1303.pdf.

Acuvim-L Multifunction Power and Energy Meter Datasheet. Revision Date: May 2022 Version: 1.0.3. Retrieved Jul. 12, 2022 from https://accucdn.accuenergy.com/wp-content/uploads/Acuvim-L-Multifunction-Power-and-Energy-Meter-Datasheet.pdf.

Acuvim-L Multifunction Power and Energy Meter User's Manual. V: 3.05 Revised: Feb. 2022. Retrieved Jul. 12, 2022 from https://accucdn.accuenergy.com/wp-content/uploads/Acuvim-L-Multifunction-Power-and-Energy-Meter-User-Manual.pdf.

AcuRev 2100 Multi-Circuit Submeter Datasheet. Revision Date: Apr. 2022 Version: 1.0.1. Retrieved Jul. 12, 2022 from https://accucdn.accuenergy.com/wp-content/uploads/AcuRev-2100-Multi-Circuit-Submeter-Datasheet.pdf.

AcuRev 2100 Smart Metering System User's Manual. V: 1.0 Revised: Oct. 2020. Retrieved Jul. 12, 2022 from https://accucdn.accuenergy.com/wp-content/uploads/AcuRev-2100-Multi-Circuit-Power-Energy-Meter-User-Manual.pdf.

AcuRev 1310 DIN Rail Power and Energy Meter Datasheet. Revision Date: May 2022 Version: 1.0.2. Retrieved Jul. 12, 2022 from https://accucdn.accuenergy.com/wp-content/uploads/AcuRev-1310-DIN-Rail-Power-and-Energy-Meter-Datasheet.pdf.

AcuRev 1310 DIN-Rail Power Meter User's Manual. V: 1.2.2 Revised: Apr. 2022. Retrieved Jul. 12, 2022 from https://accucdn.accuenergy.com/wp-content/uploads/AcuRev-1310-User-Manual.pdf.

* cited by examiner

INTELLIGENT ELECTRONIC DEVICE WITH A DETACHABLE DISPLAY MODULE

FIELD OF THE INVENTION

The present disclosure generally relates to the field of intelligent electronic devices for electrical utility services and, more specifically, to power meters with a detachable display module.

BACKGROUND

Monitoring electrical energy is a fundamental function within any electrical power distribution system. Electrical energy may be monitored to determine usage and power quality. A device that monitors electrical energy may be an intelligent electronic device. The display module provides a visual user interface to the users.

Some intelligent electronic devices, such as power meters, can support both panel mount and DIN-rail mount. Sometimes the display module is secured to power meters with parts, such as screws. In many cases, it may be necessary to use a tool, such as a screwdriver, to attach or detach the display module from power meters.

What would be desirable is an intelligent electronic device with a display module that is easier to attach or detach. What would also be desirable is an intelligent electronic device that permits a user to attach or detach a display module with a minimum number of parts and without requiring the use of tools.

SUMMARY

According to an aspect of the present disclosure, an intelligent electronic device for measuring a characteristic of electricity is disclosed. The intelligent electronic device includes: a housing of the intelligent electronic device having a front and a rear, the housing defining an interior volume and including therein a sensor configured to sense a characteristic of electricity, the rear of the housing including a first protuberance structure disposed on a first outer surface thereof, the first protuberance structure containing elongate protrusions and at least one hexagonal protrusion on a second outer surface thereof, wherein the first protuberance structure can be optionally connected to a DIN rail or a display module, the elongate protrusions include upper protrusions and lower protrusions, space is formed between the upper protrusions and lower protrusions, the lower protrusions include left protrusions and right protrusions, the at least one hexagonal protrusion is disposed between the left protrusions and right protrusions.

In some embodiments, the space is adapted to accommodate the DIN rail. In some embodiments, the device further comprises a mounting clip installed on the first protuberance structure, adapted to move between an unlocked position and a locked position with an external force along the at least one hexagonal protrusion; and further includes at least one engagement portion, wherein the at least one engagement portion engages with the lower flange of the DIN rail when the mounting clip is disposed on the locked position, and disengages with the lower flange of the DIN rail when the mounting clip is disposed on the unlocked position. In some embodiments, at least one tab is disposed on the upper protrusions extending into the space which is adapted to engage with the upper flange of the DIN rail. In some embodiments, the mounting clip includes at least one opening below the at least one engagement portion. In some embodiments, the mounting clip further comprises two flexible prongs extending upward into one of the at least one opening and the two flexible prongs are substantially parallel to the second outer surface. In some embodiments, a leg is disposed on the top of each prong and extends inwards and the leg is substantially perpendicular to the second outer surface. In some embodiments, the legs of the two flexible prongs are adapted to move along the opposite sides of one of the at least one hexagonal protrusion. In some embodiments, the distance between the legs of the two flexible prongs in non-deformation state is less than the length of the central diagonal of one of the at least one hexagonal protrusion. In some embodiments, a first tab extending downward into one of the at least one opening from the top of the at least one opening is disposed above the two left flexible prongs, the first tab engages with the top of one of the at least one hexagonal protrusion when the mounting clip is disposed on the unlocked position. In some embodiments, a first opening is disposed on the bottom of the mounting clip which is adapted to pull or push the mounting clip. In some embodiments, the periphery of the first protuberance structure is substantially octagonal. In some embodiments, the outer surface of the first elongate protrusions along the periphery is adapted to connect with the display module. In some embodiments, at least one elongate protrusion of the first elongate protrusions along the periphery has an aperture on either side thereof. In some embodiments, a convex portion is disposed on the outer surface of the at least one elongate protrusion, the convex portion is adapted to engage with the corresponding concave portion disposed on the display module. In some embodiments, the first outer surface is higher than the second outer surface. In some embodiments, the height difference between the first outer surface and the second surface is equal to the thickness of a door panel used in a panel configuration. In some embodiments, a first housing of the display module includes a first front and a first rear; the first rear of the first housing includes a second protuberance structure disposed on the third outer surface thereof, the second protuberance structure comprises first elongate protrusions, an upper hexagonal protrusion, and a lower hexagonal protrusion, disposed on the third outer surface of the first rear; wherein a first periphery formed by the first elongate protrusions is adapted to engage with the intelligent electronic device; the lower hexagonal protrusion is adapted to co-work with a lower mounting clip to secure the display module to the intelligent electronic device; and the higher hexagonal protrusion is adapted to co-work with a higher mounting clip to secure the display, module to the intelligent electronic device. In some embodiments, the first periphery is substantially octagonal. In some embodiments, the first elongate protrusions include at least one lateral elongate protrusion that spans across left portion and right portion of the first perimeter. In some embodiments, wherein at least one first elongate protrusion of the first elongate protrusions along the perimeter is adjacent to an aperture on each side thereof. In some embodiments, wherein a concave portion is disposed on the inner surface of the at least one first elongate protrusion, the concave portion is adapted to engage with the corresponding convex portion of the intelligent electronic device. In some embodiments, wherein the upper protrusions include a first protrusion which has two adjacent apertures each on either side of the first protrusion, the first protrusion has a first tab extending upward, the upper mounting clip is adapted to engage with the first tab. In some embodiments, the lower protrusions include a second protrusion which has two adjacent apertures each on either side of the second protrusion, the second protrusion has second tab extending downward, the lower mounting clip is adapted to engage with the second tab. In some embodiments, the first protuberance structure further includes a display connector on the second outer surface configured to receive a corresponding connector of the display module.

According to an aspect of the present disclosure, an intelligent electronic device assembly is disclosed. The intelligent electronic device assembly includes: an intelligent electronic device, a display module, a mounting clip with two sliding members, an upper mounting clip and a lower mounting clip with one sliding member. The intelligent electronic device comprises a housing of the intelligent electronic device having a front and a rear, the housing defines an interior volume and including therein a sensor configured to sense a characteristic of electricity, the rear of the housing includes a first protuberance structure disposed on a first outer surface thereof, the first protuberance structure contains elongate protrusions, a left hexagonal protrusion, and a right hexagonal protrusion on a second outer surface thereof, the first protuberance structure can be optionally connected to a DIN rail or a display module, the elongate protrusions include upper protrusions and lower protrusions, space is formed therebetween, the lower protrusions include left protrusions and right protrusions, the at least one hexagonal protrusion is disposed therebetween. The mounting clip with two sliding members is adapted to co-work with the left hexagonal protrusion, and the right hexagonal protrusion to optionally configure the intelligent electronic device in a DIN rail mount configuration. The display module has a first housing that includes a first front and a first rear, the first rear of the first housing includes a second protuberance structure disposed on the third outer surface thereof, the second protuberance structure comprises first elongate protrusions, an upper hexagonal protrusion, and a lower hexagonal protrusion, disposed on the third outer surface of the first rear, a first periphery formed by the first elongate protrusions is adapted to engage with the intelligent electronic device; the lower hexagonal protrusion is adapted to co-work with a lower mounting clip with a sliding member to optionally, configure the intelligent electronic device in a panel mount configuration, the higher hexagonal protrusion is adapted to co-work with a higher mounting clip with a sliding member to optionally configure the intelligent electronic device in a panel mount configuration.

The foregoing and additional aspects of the present disclosure will be apparent to those of ordinary sill in the art in view of the detailed descriptions of various aspects, which are made with reference to the drawing, a brief description of which is provided next.

BRIEF DESCRIPTION OF THE DRAWINGS

The foregoing and other advantages of the present disclosure will become apparent upon reading the following detailed description and upon reference to the drawing.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimension, and materials are illustrated for the various elements, those skilled in the art can recognize that many of the examples provided have suitable alternatives.

As used herein, Intelligent Electronic Devices ("IEDs") can be any device that senses electrical parameters and computes data including, but not limited to, Programmable Logic Controllers ("PLCs"), Remote Terminal Units ("RTUs"), power meters, protective relays, fault recorders, phase measurement units, and other devices which are coupled with power distribution networks to control and manage the distribution or consumption of electrical power. While in some instances, the disclosure may be described and/or illustrated with respect to a power meter, this is merely for illustrative purposes. It should be recognized that the disclosure pertains equally to a variety of other LEDs.

Figure 1:
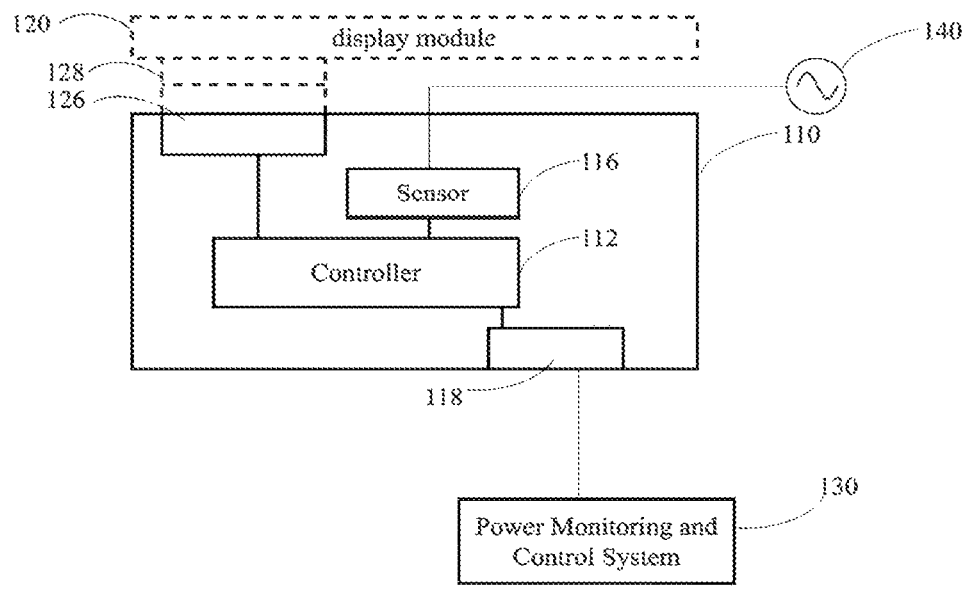
FIG. 1 is a functional block diagram of an exemplary intelligent electronic device with a detachable display module.

Herein the phrase "coupled" is defined as "directly connected to or indirectly connected with" one or more intermediate components. Such intermediate components may include both hardware and software-based components, FIG. 1 is a functional block diagram of an intelligent electronic device 110 connected with a display module 120 within a power distribution system 140, The intelligent electronic device 110 includes a sensor 116, which can include one or more sensors each configured to sense a characteristic of electricity, such as current or voltage. The intelligent electronic device 110 further includes a controller 112, which can include one or more processing units such as Central Processing Unit or Digital Signal Processing Unit. The electronic components in the intelligent electronic device 110 can be provided on one or more printed circuit boards or backplanes. The controller 112 may be coupled to a plurality of interfaces that allow communications with various systems external to the intelligent electronic device 110. For example, the controller 112 may be coupled to a communication interface 118 that can be coupled to a power monitoring and control system 130 which may be remote and external from the IED 100. The communications interface 118 may include an electrical port, such as RS485 port, for receiving an RS485 connector. The controller 112 may also be coupled to a display interface 126 that can include a display port or connector for receiving a corresponding display connector or plug 128 from an optional display module 120.

Figure 2:
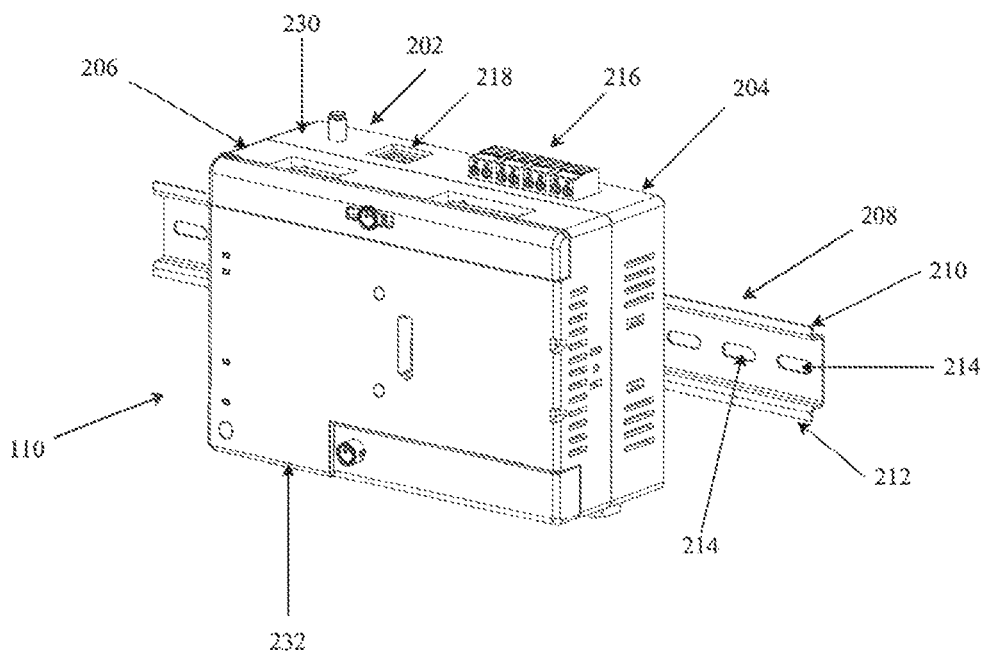
FIG. 2 is a perspective front view of an intelligent electronic device configured to be mounted on a DIN rail.
Figure 11:
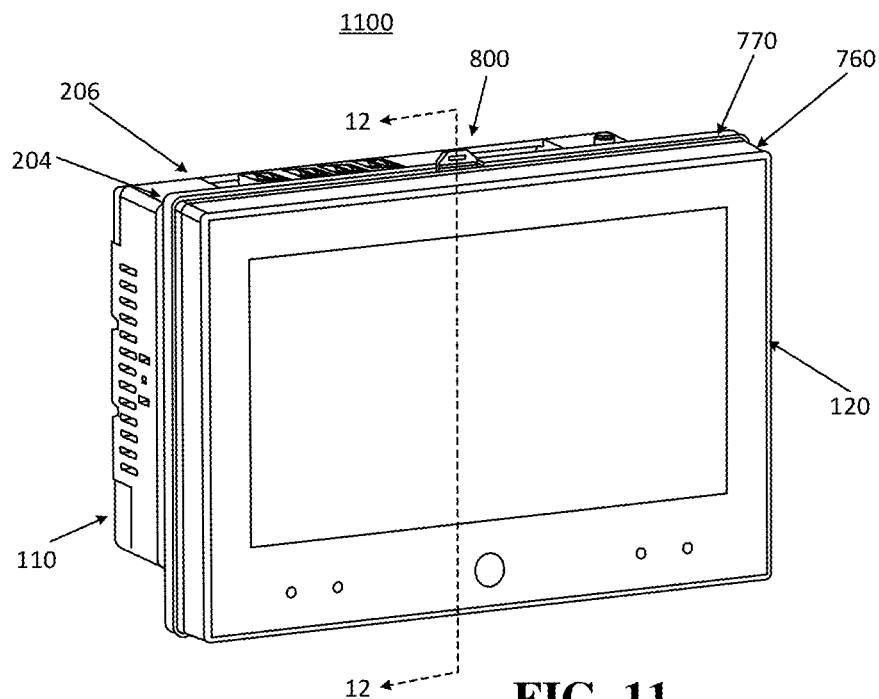
FIG. 11 is a perspective front view of an intelligent electronic device connected with a display module.

The intelligent electronic device 110 may be mounted on a DIN rail 208 without a display module 120 attached, such as shown in FIG. 2. In another configuration, the intelligent electronic device 110 can be configured to be mounted with a display module 120 and mounted through a cut-out in a door panel, such as shown in FIG. 11. For convenience, the former configuration shall be referred to herein as a DIN rail mount configuration, whereas the latter configuration shall be referred to herein as a panel mount configuration. When the intelligent electronic device 110 is configured in DIN rail mount configuration, information relating to the characteristic of electricity sensed by the sensor 116 can be sent to power monitoring and control system 130 through the communications interface 118.

FIG. 2 is a perspective view of the illustrative intelligent electronic device 110 having a housing 202. In this illustrative embodiment, the intelligent electronic device 110 is a power meter without a display module attached. In some instances, the intelligent electronic device 110 may be installed upside-down on DIN rail 208, if desired.

In this illustrative embodiment, the housing 202 of intelligent electronic device 110 may include a front housing 206 and a rear housing 204 that may snap, fit, or otherwise be secured together. The rear housing 204 may include a structure that permits the intelligent electronic device to be mounted, or otherwise secured, to DIN rail 208. The DIN rail 208 may include an upper flange 210 and a lower flange 212. The DIN rail 208 may be formed of any suitable material and have any suitable dimensions. In some instances, the DIN rail 208 may be formed having a particular or standardized height and/or width but may be any desired length. The DIN rail 208 may include mounting apertures 214 to attach to a surface, such as a wall.

The housing 202 includes a top 230 opposite a bottom 232. It should be noted that the terms "front," "rear," "top," "bottom," and "side" are not necessarily indicative of their orientation relative to gravity or earth but rather to differentiate the individual surfaces of the housing from one another for ease of discussion.

The intelligent electronic device 110 may have one or more connectors such as 216, 218, 220, 222 (FIG. 2 and FIG. 3) that can be accessible from the top 230 and/or bottom 232 of the housing 202. The connectors 216, 218, 220, 222 can include one or more of a current input connector for receiving one or more current input from connected current sensors, a voltage input connector for receiving one or more voltage inputs from connected voltage sensors, a data connector for receiving input and output signals between the power meter and an external system, a power supply connector supplying power to the electronic components of the power meter, or a communications connector configured to carry communication signals to a remote monitoring and control system or to another meter device, like the intelligent electronic device 110.

Figure 3:
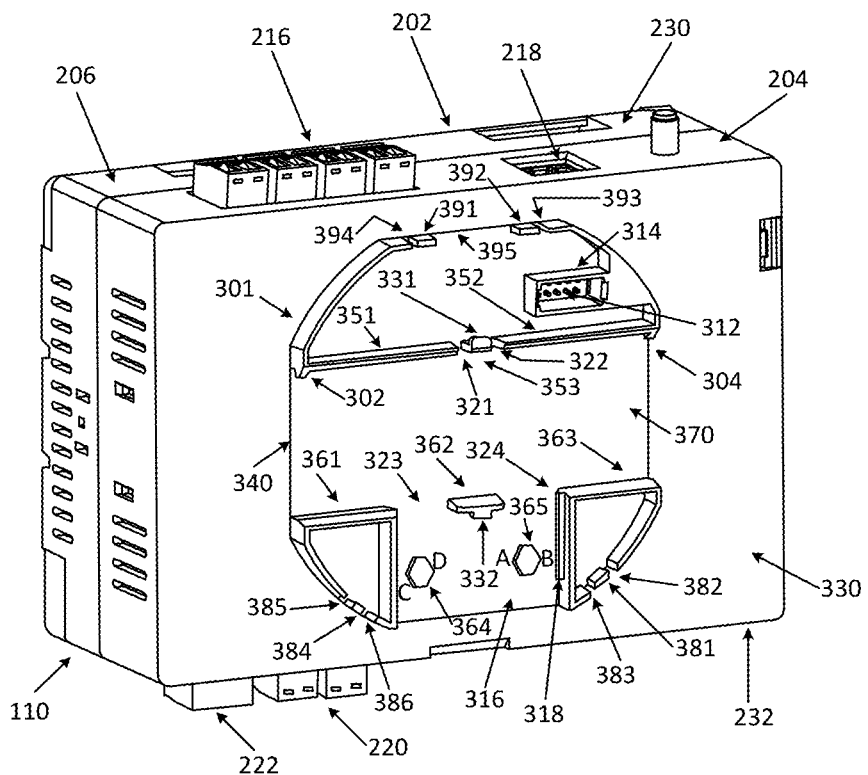
FIG. 3 is a perspective rear view of an intelligent electronic device with a structure that can be mounted to a DIN rail or a display module.

FIG. 3 is a perspective rear view of the illustrative intelligent electronic device 110 of FIG. 1, providing a better view of rear housing 204. In the illustrative embodiment, the rear housing 204 can include a rear outer surface 330. The intelligent electronic device 110 may include a first protuberance structure 301, which can be optionally connected to a DIN rail 208 or a display module 120. The periphery of the first protuberance structure 301 is substantially octagonal.

In the illustrative embodiment, the first protuberance structure 301 may have an outer surface 340, which is higher than the rear outer surface 330. The first protuberance structure 301 includes some elongate protrusions such as 351, 352, 353, 361, 362, 363, 391, 392, 381, 384, positioned on the outer surface 340.

In the illustrative embodiment, the first protuberance structure 301 may include upper protrusions and/or lower protrusions. The upper protrusions can comprise elongate protrusions 351, 352, 353, 391, 392. The lower protrusions may consist of elongate protrusions 361, 362, 363, 381, 384.

In the illustrative embodiment, space 370 may be formed between the upper protrusions 351, 352, 352 and the lower protrusions 361, 362, 363, The space 370 may be appropriate to accommodate DIN rail 208.

In the illustrative embodiment, the lower protrusions may be comprised of left protrusions and right protrusions. The left protrusions can include elongate protrusions 361, 384. The right protrusions can include elongate protrusions 363, 381. Hexagonal protrusion 364 and hexagonal protrusion 365 are disposed between the left protrusion 361 and the right protrusion 363.

In the hexagonal protrusion 365, there can be a central diagonal AB, wherein the central point A and B are central vertices of a hexagon on the top of the hexagonal protrusion 365. The central diagonal AB is parallel to the top edge of rear surface 330. Similarly in the hexagonal protrusion 364, there is a central diagonal CD, wherein the central point C and D are central vertices of a hexagon on the top of the hexagonal protrusion 364. The central diagonal CD is also parallel to the top edge of rear surface 330.

In the illustrative embodiment, there can be two apertures 385 and 386, each disposed on either side of the elongate protrusion 384. With the two apertures 385 and 386, the elastic force of the protrusion 384 is enhanced. There can be a convex portion on the outer surface of the elongate protrusion 384, When the display module 120 is secured to the intelligent electronic device 110, the concave portion on the inner surface of protrusion 732 can firmly engage with the convex portion on the outer surface of protrusion 384 with the enhanced elastic force. The enhanced elastic force helps to prevent the display module 120 from disconnecting from the intelligent electronic device 110.

In the illustrative embodiment, there can be two apertures 382 and 383, which may be disposed on either side of the elongate protrusion 381. The two apertures 382 and 383 can enhance the elastic force of the protrusion 381. There can be one convex portion on the outer surface of elongate protrusion 381. When the display module 120 is secured to the intelligent electronic device 110, the concave portion on the inner surface of elongate protrusion 720 can firmly engage with the convex portion on the outer surface of elongate protrusion 381 with the enhanced elastic force. The enhanced elastic force may help to prevent the display module 120 from disconnecting from the intelligent electronic device 110.

In the illustrative embodiment, there are two apertures 394 and 395, that can be disposed on either side of the elongate protrusion 391. The two apertures 394 and 395 can enhance the elastic force of the elongate protrusion 391. There can be one convex portion on the outer surface of elongate protrusion 391. When the display module 120 is connected to the intelligent electronic device 110, the concave portion on the inner surface of elongate protrusion 751 can firmly engage with the convex portion on the outer surface of elongate protrusion 391 with the enhanced elastic force.

In the illustrative embodiment, there can be two apertures 393 and 395, each disposed on either side of the elongate protrusion 392. The two apertures 393 and 395 can enhance the elastic force of the elongate protrusion 392. There can be one convex portion on the outer surface of elongate protrusion 392. When the display module 120 is fit to the intelligent electronic device 110, the concave portion on the inner surface of elongate protrusion 741 can be firmly engaged to the convex portion on the outer surface of elongate protrusion 392 with the enhanced elastic force.

In the illustrative embodiment, there can be a tab 302 that can be formed within the elongate protrusion 351 and can extend partially into space 370 and parallel to the outer surface 340. There can be another tab 304 that can be formed within the elongate protrusion 352 and can extend partially downward into space 370 and can be parallel to the outer surface 340. In the illustrative embodiment, two tabs 302 and 304 can be provided. However, it may be that elongate protrusion 351 or 352 may include only a single tab or may include three, four, or more tabs. The number of tabs may be adjusted to suit a particular application. In some instances, tab 302 or 304 may be a rigid latch or another physical element that extends partially into the space 370. Tab 302 or tab 304 may be used to engage with the upper flange 210 of the DIN rail 208 in a DIN rail mount configuration.

In the illustrative embodiment, there can be a tab 331 that may be formed within the elongate protrusion 353. Tab 331 extends upward and substantially parallel to the outer surface 340. Elongate protrusion 353 may be one of the upper protrusions, There can be an aperture 321 to the left of tab 331. There can be another aperture 322 to the right of tab 331. The inner surface of tab 331 can be used to engage with the outer surface of an engagement portion 810 that can be disposed on the upper mounting clip to secure the display module 112 to the intelligent electronic device 110. With the two, adjacent apertures 321 and 322, the elastic force of the elongate protrusion 353 is enhanced such that the display module 112 is firmly secured to the intelligent electronic device 110.

In the illustrative embodiment, there can be a tab 332 that may be formed within the elongate protrusion 362. Tab 332 can extend downward and may be substantially parallel to the outer surface 340. The elongate protrusion 362 can be one of the lower protrusions. There can be an aperture 323 to the left of tab 331. There can be another aperture 324 to the right of tab 332. The inner surface of tab 332 may be used to engage with the outer surface of the engagement portion 810' that can be disposed on lower mounting clip 400 to secure the display module 112 to the intelligent electronic device 110. With the two, adjacent apertures 323 and 324, the elastic force of the elongate protrusion 362 may be enhanced such that the display module 112 can be firmly secured to the intelligent electronic device 110.

In the illustrative embodiment, the first protrusion structure 301 may include a connector 312, such as a pin header, that can be disposed on the outer surface 340 and a display mount 314 which may be positioned on the outer surface 340. The connector 312 may be configured to receive a corresponding connector 790 of the display module 120. The display mount 314 may be configured to secure the display module 120 to the intelligent electronic device 110, which can cause the display connector 312 to be mechanically and electrically coupled to the corresponding connector 790 of the display module 120.

In the illustrative embodiment, the elongate protrusion 363 can have a flange 318 located on the leftmost position. The inner surface of flange 318 can be used to engage with the outer surface of the right flange 421' of a mounting clip 400. Similarly, the elongate protrusion 361 may have another flange 319 (shown in FIG. 12) located on the rightmost position. The inner surface of flange 319 can be used to engage with the outer surface of the left flange 421 of mounting clip 400. The space between elongate protrusion 361 and elongate protrusion 363 may form a bracket 316 that can be used to accommodate the mounting clip 400.

Figure 4:
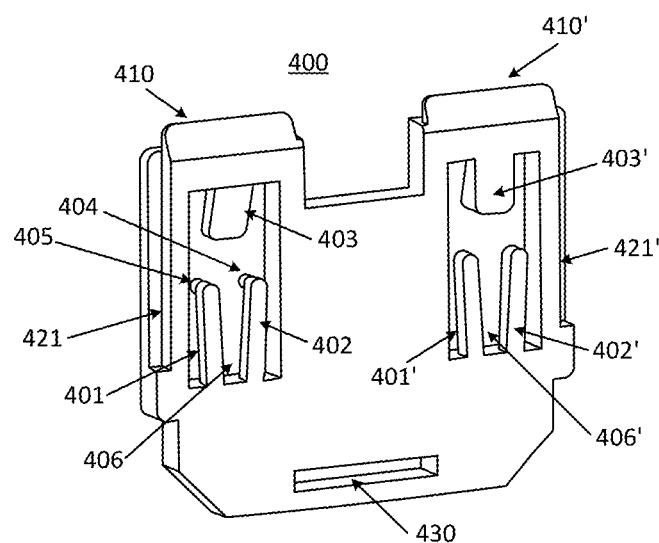
FIG. 4 is a perspective view of a mounting clip with two sliding members.

FIG. 4 is a perspective view of an illustrative mounting clip 400 with two sliding members. The mounting clip 400 may adopt a bi laterally symmetric structure. The left half of the mounting clip 400 can be described in detail and the right half is the same as the left half part. The parts in the right half can be numbered in like manner with a suffix-'. The mounting clip 400 includes a left engagement portion 410 and a right engagement portion 410' on the top of the mounting clip 400. The left engagement portion 410 and the right engagement portion 410' can be used to engage with the lower flange 212 of DIN rail 208. There is one opening 430 which can be disposed on the bottom of the mounting clip 400 and may make it easier for users to push or pull the mounting clip 400. There is another opening 406 on the left half of the mounting clip 400 which may be disposed between the engagement portion 410 and opening 430. Two flexible prongs 401 and 402 can extend upward into the opening 406 from the bottom of the opening 406.

It should be recognized that, in some cases, mounting clip 400 may include only one engagement portion or more than two engagement portions.

A leg 405 can be disposed on the far end of prong 401 and can extend into the opening 406. The leg 405 can be substantially perpendicular to the surface 340 when the mounting clip 400 which can be mounted on the intelligent electronic device 110. A leg 404 may be disposed on the far end of prong 404 and may extend upward into the opening 406. The leg 404 can be substantially perpendicular to the surface 340 when the mounting clip 400 is mounted on the intelligent electronic device 110. Both prong 401 and prong 402 can be substantially parallel to the surface 340 when the mounting clip 400 is mounted on the intelligent electronic device 110.

A tab 403 may gradually extend into the opening 406 downwards from the top of the opening 406, which can be used to engage with the top of the hexagonal protrusion. At the leftmost end of the mounting clip 400, there can be a flange 421. The outer surface of flange 421 can engage with the inner surface of flange 319 when the mounting clip 400 is mounted on the intelligent electronic device 110. At the rightmost end of the mounting clip 400, there can be a flange 421'. The outer surface of flange 421' can engage with the inner surface of flange 318 when the mounting clip 400 is mounted on the intelligent electronic device 110.

The leg 405 and leg 404 can move up and down along the sides of hexagonal protrusion 364 when the mounting clip 400 is mounted on the intelligent electronic device 110. The leg 405 and leg 406 make up the left sliding member, and hexagonal protrusion 364 can make up the left track member. Similarly, the leg 405' and leg 404' (NOT shown in FIG. 4) make up the right sliding member, and hexagonal protrusion 364 can make up the right track member. The mounting clip 400 includes two sliding members. The first protuberance structure 301 can include two track members. A mounting clip 800 with one sliding member can be described later.

Figure 5:
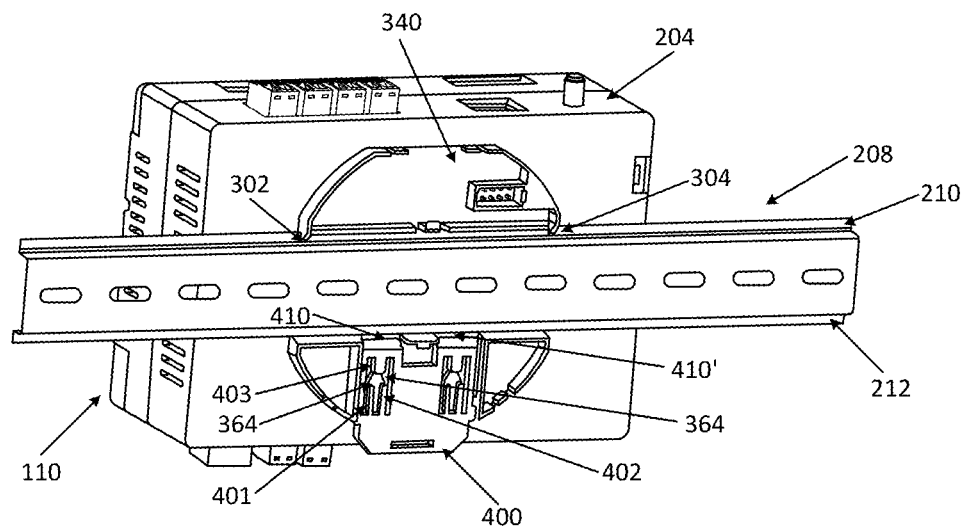
FIG. 5 is a perspective rear view of an intelligent electronic device that is connected to a DIN rail and arranged in an unlocked position.

FIG. 5 is a perspective view of an illustrative intelligent electronic device 110 in a DIN rail mount configuration with the mounting clip 400 arranged in an unlocked position. The engagement portion 410 and 410' may disengage with the lower flange 212 of DIN rail 208 when the mounting clip 400 is arranged in the unlocked position. The intelligent electronic device 110 can be easily dismounted from the DIN rail 208 in the unlocked position. Tabs 302 and 304 may engage with the upper flange 210 when the mounting clip 400 is arranged in the unlocked position.

To install the intelligent electronic device 110 on a DIN rail 208, the mount clip 400 may need to first be mounted into a bracket 316. After the mount clip 400 is mounted, the bottom of tab 403 can be disposed on the top of the hexagonal protrusion 364 and the bottom of tab 403' can be disposed on the top of the hexagonal elongate protrusion 365.

In the illustrative embodiment, the leg 405 may be substantially perpendicular to the surface 340. The leg 404 may be substantially perpendicular to the surface 340. Both prong 401 and prong 402 can be substantially parallel to the surface 340.

In the illustrative embodiment, the connection line between legs 404 and 405 can be below the central diagonal CD. The connection line between the legs 404' and 405' can be below the central diagonal AB.

The prongs 401 and 402 may work in two states: a non-deformation state and a deformation state. When there is not any external force exerted on the legs of the prong 401 and the prong 402, the prong 401 and the prong 402 can work in the non-deformation state. When there is an external force exerted on the legs of the prong 401 and the prong 402, the prong 401 and the prong 402 can work in the deformation state. In the non-deformation state, the distance between leg 404 and 405 may be less than the length of the central diagonal CD. The prongs 401' and 402' can have the same work same as the prongs 401 and 402.

When the user pushes the mounting clip 400 upwards, the leg 404 and the leg 405 move up along the two sides of the hexagonal protrusion 364. When the leg 404 and the leg 405 are moved closer to the central diagonal CD, the leg 404 and the leg 405 are deformed outwards. The deformation can cause a friction force and the user must exert an appropriate force to overcome the friction force by pushing the mounting clip 400 up to a locked position. After the user pushes the mounting clip 400, the mounting clip 400 can be disposed in a locked position. A leg 404' and a leg 405' have the same work same as the leg 404 and the leg 405.

Figure 6:
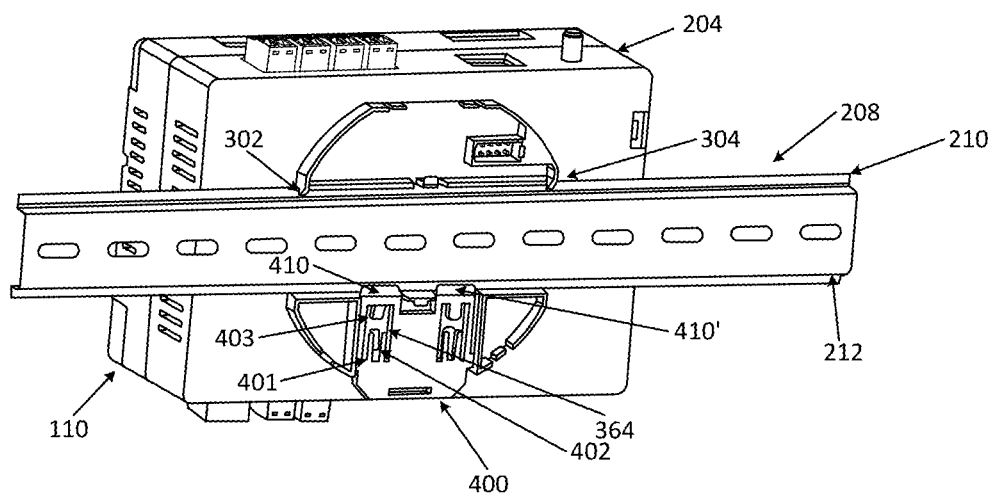
FIG. 6 is a perspective rear view of an intelligent electronic device that is connected to a DIN rail and arranged in a locked state.

FIG. 6 is a perspective view of an illustrative intelligent electronic device 110 in a DIN rail mount configuration with the mounting clip 400 disposed in a locked position. Engagement portion 410 and engagement portion 410' may engage with the lower flange 212 of DIN rail 208. The intelligent electronic device 110 can be secured to the DIN rail 208 in the locked position.

In the locked position, the segment between leg 404 and leg 405 can be above the central diagonal CD. The segment between leg 404' and leg 405' can be above the central diagonal AB, The friction force caused by the deformation of the prong 401 and prong 402 may lock the mounting clip 400 into a fixed position.

If the user wants to dismount the intelligent electronic device 110 from DIN rail 218, the user may need to pull the mounting clip 400 to an unlocked position. It may be convenient for a user to switch the mounting clip 400 between the locked position and unlocked position, which may be done by pulling or pushing the mounting clip 400.

Figure 7:
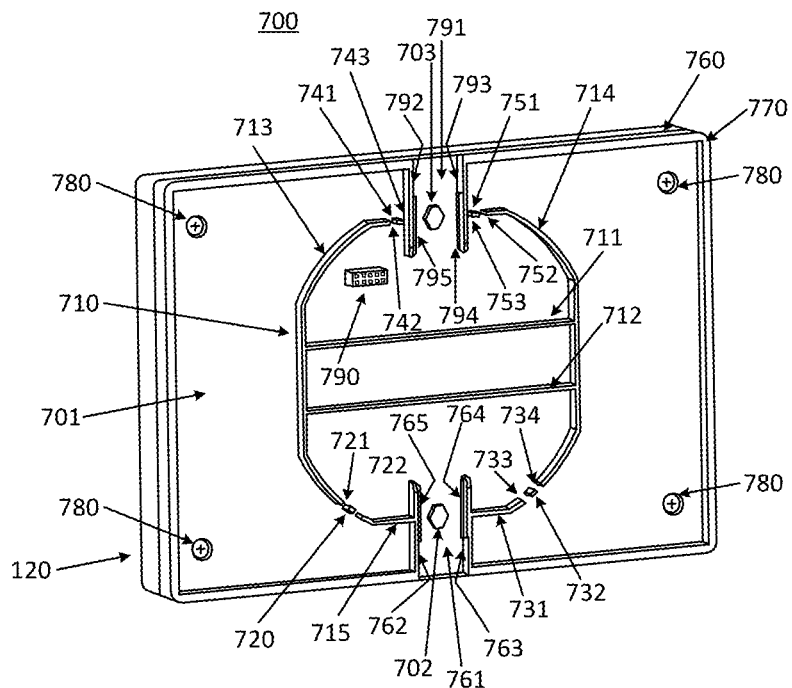
FIG. 7 is a perspective rear view of a display module with a structure that can be mounted to an intelligent electronic device.

FIG. 7 is a perspective rear view of an illustrative display module 120 of FIG. 1, In the illustrative embodiment, the display module 120 can include a front housing 760 and a rear housing 770. In the illustrative embodiment, the rear housing 770 may be secured to the front housing 760 by four screws 780. Rear housing 770 may include an outer surface 701. In the illustrative embodiment, display module 120 may include a second protuberance structure 710 that can be disposed on the outer surface 701. The second protuberance structure 710 can be used to secure the intelligent electronic device 110 to the display module 120. The second protuberance structure 710 may include left protrusions and right protrusions. The left protrusions may include elongate protrusions 713, 720, 715, 741. The right protrusions may include elongate protrusions 751, 714, 732, 731. The second protuberance structure 710 may include elongate protrusions 711 and 712 which span laterally from the left protrusions to the right protrusions. The elongate protrusions 711 and 712 can help to increase the stability of the left protrusions and/or the right protrusions. All the preceding elongate protrusions can be positioned on the outer surface 701.

In the illustrative embodiment, there are two apertures 733 and 734, that can each be disposed on either side of the elongate protrusion 732. With the two apertures 733 and 734, the elastic force of the elongate protrusion 732 can be enhanced. There can be a concave portion on the inner surface of elongate protrusion 732. When the display module 120 can be secured to the intelligent electronic device 110, the concave portion on the inner surface of protrusion 732 may firmly engage with the convex portion on the outer surface of an elongate protrusion 384 with the enhanced elastic force.

In the illustrative embodiment, there are two apertures 721 and 722, each of which can be disposed on either side of an elongate protrusion 720. With the two apertures 721 and 722, the elastic force of the elongate protrusion 720 can be enhanced. There can be one concave portion on the inner surface of the elongate protrusion 720. When the display module 120 is fit to the intelligent electronic device 110, the concave portion on the inner surface of an elongate protrusion 732 can firmly engage with the convex portion on the outer surface of an elongate protrusion 381 with the enhanced elastic force.

In the illustrative embodiment, there are two apertures 752 and 753, each of which can be disposed on either side of an elongate protrusion 751. With the two apertures 752 and 753, the elastic force of the elongate protrusion 751 may be enhanced. There can be a concave portion on the inner surface of the elongate protrusion 751. When the display module 120 is fit to the intelligent electronic device 110, the concave portion on the inner surface of the elongate protrusion 751 may firmly engage with the convex portion on the outer surface of an elongate protrusion 391 with the enhanced elastic force.

In the illustrative embodiment, there are two apertures 742 and 743, each of which can be disposed on either side of an elongate protrusion 741. With the two apertures 742 and 743, the elastic force of the elongate protrusion 741 may be enhanced. There can be one concave portion on the inner surface of the elongate protrusion 741. When the display module 120 is fit to the intelligent electronic device 110, the concave portion on the inner surface of the elongate protrusion 741 may firmly engage with the convex portion on the outer surface of an elongate protrusion 392 with the enhanced elastic force.

In the illustrative embodiment, a bracket 791 positioned on the upper portion of the display module 120 can accommodate an upper mounting clip. The bracket 791 may include elongate protrusions 792 and 793 extending longitudinally along with the display module 120. Elongate protrusion 792 may include a flange 795, which can be used to engage with the flange of an upper mounting clip. The elongate protrusion 793 can include a flange 794, which can be used to engage with the flange of an upper mounting clip. A hexagonal protrusion 703, which can be used as a track member, may be positioned between the elongate protrusion 792 and the elongate protrusion 793.

In the illustrative embodiment, a bracket 761 can be positioned on the lower portion of the display module 120 can accommodate a lower mounting clip. Bracket 761 can include elongate protrusions 762 and 763 can be extending longitudinally along with the display module 120. Elongate protrusion 762 may include a flange 765, which can be used to engage with the flange of a lower mounting clip. Elongate protrusion 763 may include a flange 764, which can be used to engage with the flange of a lower mounting clip. A hexagonal protrusion 702 can be positioned between elongate protrusion 762 and elongate protrusion 763.

In the illustrative embodiment, the second protrusion structure 710 can include a connector 790 disposed on the outer surface 701. The connector 790 can be configured to connect with a corresponding connector 312 of the intelligent electronic device 110.

Figure 8:
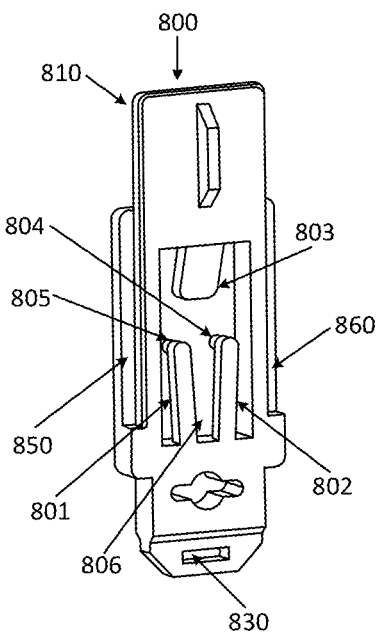
FIG. 8 is a perspective view of a mounting clip with a sliding member.

FIG. 8 is a perspective view of illustrative mounting clip 800. The mounting clip 800 can include an engagement portion 810 disposed on the top thereof. The engagement portion 810 can be used to engage with tab 331 or tab 332 of intelligent electronic device 110. There can be one opening 830 disposed on the bottom of the mounting clip 800 that make it easier for users to push or pull the mounting clip 800. There can be another opening 806 disposed between the engagement portion 810 and the opening 830. Two flexible prongs 801 and 802 may extend upwards from the bottom of the opening 806 and into the opening 806. The prong 801 can have a leg 805 that may be substantially perpendicular to prong 801. Both prong 801 and prong 802 can be substantially, parallel to the outer surface 701 when mounting clip 800 can be mounted on the display module 120. A tab 803 can extend into the opening 806 gradually downwards from the top of opening 806. A flange 850 may be positioned at the leftmost of the mounting clip 800. Another flange 860 may be disposed at the rightmost of the mounting clip 800. Both flange 850 and flange 860 can be used to engage with the display module 120 when mounting clip 800 is mounted on the display module 120.

The leg 804 and leg 805 can move up and down along the sides of hexagonal protrusion 703 when mounting clip 800 is mounted on the display module 120. The leg 804 and leg 805 can make up a sliding member, and hexagonal protrusion 703 can make up a track member. The mounting clip 800 can include one sliding member. The second protuberance structure 710 can include one track member 703 on the upper portion of the display module 120. The mounting clip 800 can be one variant of mounting clip 400. In some instances, the mounting clip 400 and mounting clip 800 can be replaced with each other.

Figure 9:
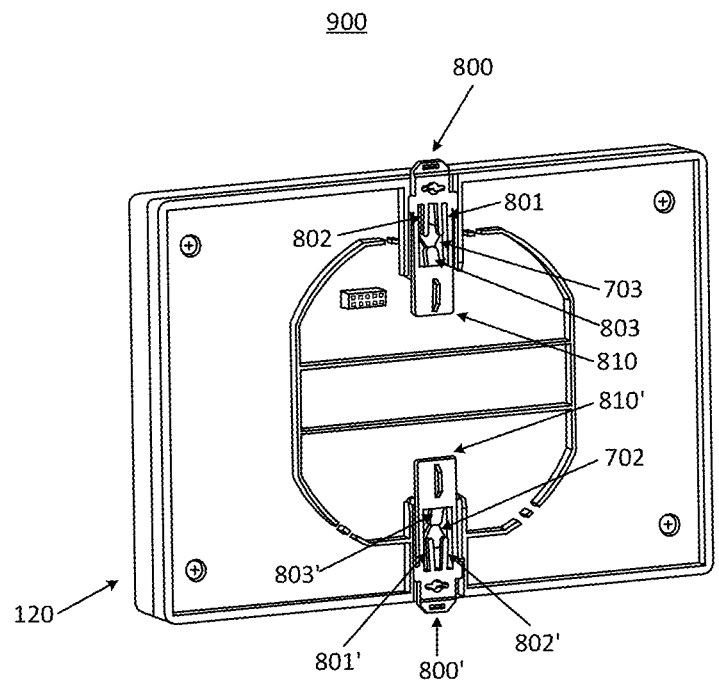
FIG. 9 is a perspective view of a display module with a mounting clip that has a sliding member and is arranged in an unlocked position.
Figure 10:
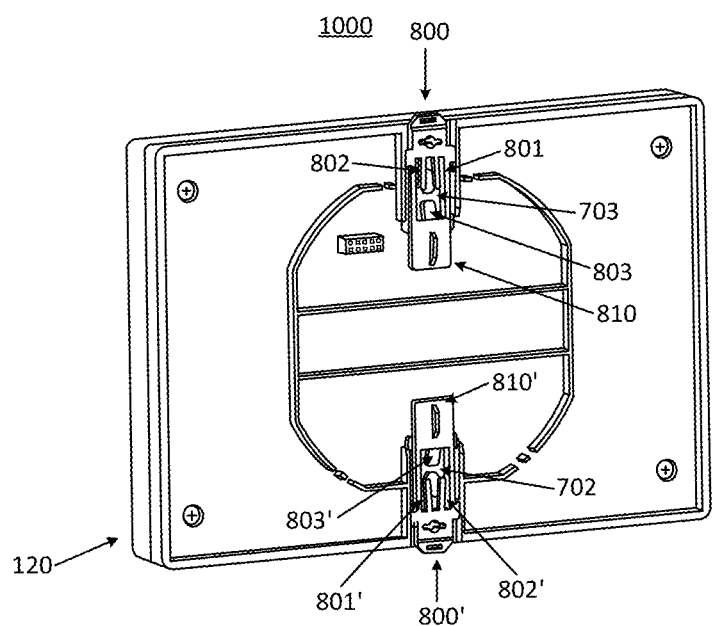
FIG. 10 is a perspective view of a display module with a mounting clip that has a sliding member and is arranged in a locked position.

A mounting clip 800 can be used as an upper mounting clip in FIG. 9 and FIG. 10, A mounting clip 800' can be used as a lower mounting clip in FIG. 9 and FIG. 10. It should be recognized that upper mounting clip 800 or lower mounting clip 800' can have the same working mechanism as the mounting clip 400. Mounting clip 800 may be compatible with one hexagonal protrusion, however the mounting clip 400 may be compatible with two hexagonal protrusions. For a person skilled in the art, mounting clip 800 can be used to replace mounting clip 400 in a DIN rail mount configuration. In this case, only one hexagonal protrusion may be needed on the intelligent electronic device 110.

FIG. 9 is a perspective view of illustrative display module 120 with the mounting clips that can be arranged in an unlocked position. There can be an upper mounting clip 800 and a lower mounting clip 800'. Mounting clip 800' may be the same as mounting clip 800.

In the illustrative embodiment, mounting clip 800 can be inserted into the bracket 791. An inner surface of flange 795 of display module 120 may engage with an outer surface of flange 850 of upper mounting clip 800. An inner surface of flange 794 of display module can engage with the flange 860 of upper mounting clip 800.

The top of the tab 803 contacts the bottom of the hexagonal protrusion 703. The legs 804 and 805 can be disposed above the central diagonal of the hexagonal protrusion 703. The connection line between legs 804 and 805 may be above the central diagonal of hexagonal protrusion 703.

The distance between leg 804 and 805 can be less than the length of the central diagonal of the hexagonal protrusion 703 when prongs 801 and 802 in a non-deformation state. When the mounting clip 800 is installed on the display module, an upper friction force between legs 804, 805 and sides of the hexagonal protrusion 703 can be generated to prevent the mounting clip 800 from dropping due to gravity.

The mounting clip 800' can be inserted into the bracket 761. The legs 804' and 805' can be disposed below the central diagonal of the hexagonal protrusion 702.

The hexagonal protrusion 702 may prevent the mounting clip 800 from moving up due to the flexibility between prong 802' and prong 803'. Tab 803' can contact the top of hexagonal protrusion 702 such that lower mounting clip 800' can be prevented from dropping.

In the illustrated embodiment, the engagement portion 810 can be above the tab 331 and the engagement 810' can be below the tab 332 such that the display module 120 can be removed easily from the intelligent electronic device 110. In the embodiment of FIG. 9, the sliding members of 800 and 800' are presented in an unlocked position.

FIG. 10 is a perspective view of an illustrative display module 120 with the mounting clips engaged with display module 120. To transition from FIG. 9 to FIG. 10, the user may need to apply an appropriate force to push upper mounting clip 800 downwards while applying an appropriate force to push lower mounting clip 800' upwards.

To transition from FIG. 10 to FIG. 9, the user may need to apply an appropriate force to pull upper mounting clip 800 upwards while applying an appropriate force to pull lower mounting clip 800' downwards.

In the illustrated embodiment, the engagement portion 810 can engage with the tab 331 and the engagement 810' can engage with the tab 332 such that the display module 120 which may not be removed easily from the intelligent electronic device 110. In the embodiment of FIG. 10, the sliding members of 800 and 800' are in a locked position.

FIG. 11 is a perspective front view of the illustrative intelligent electronic device 110 in a panel mount configuration with a display module 120. In the illustrative embodiment, upper mounting clip 800 can be pushed to make an outer surface of engagement 810 that may engage with an inner surface of tab 331. Additionally, lower mounting clip 800' can be pushed to make an outer surface of engagement 810' that may engage with an inner surface of tab 332. Due to these engagements, the display module 120 may be prevented from being removed from the intelligent electronic device 110. In the embodiment of FIG. 11, an upper mounting clip 800 and a lower mounting clip 800' are in unlocked position.

Figure 12:
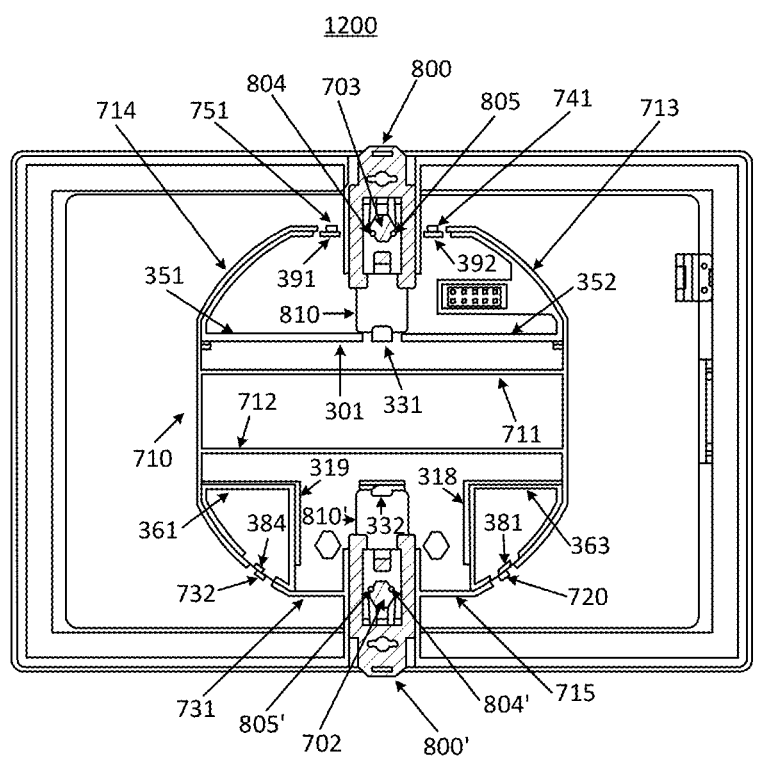
FIG. 12 is a diagrammatic, cross-section view taken along the line 12-12 shown in FIG. 11.

FIG. 12 is a diagrammatic, cross-section view taken along the line 12-12 shown in FIG. 11. In the illustrative embodiment, the inner surface of elongate protrusions along the periphery of the second protuberance structure 710 may be disposed on the outer surface 701 of the display module 120 which may engage with the outer surface of the elongate protrusions along the periphery of the second protuberance 301 that can be disposed on the outer surface 330 of the intelligent electronic device 110.

The outer surface of an elongate protrusion 351 can engage with the inner surface of an elongate protrusion 714. The outer surface of an elongate protrusion 361 can engage with the inner surface of the elongate protrusion 714. The outer surface of the elongate protrusion 361 can engage with the inner surface of an elongate protrusion 731.

The outer surface of an elongate protrusion 352 can engage with the inner surface of an elongate protrusion 713. The outer surface of an elongate protrusion 363 can engage with the inner surface of the elongate protrusion 713. The outer surface of the elongate protrusion 363 can engage with the inner surface of an elongate protrusion 715.

An elongate protrusion 711 disposed on the second protuberance structure 710 may be below the elongate protrusion 351 and the elongate protrusion 352 can be positioned on the first protuberance structure 301. An elongate protrusion 712 may be disposed on the second protuberance 710 may be above an elongate protrusion 361 and an elongate protrusion 363 can be positioned on the first protuberance structure 301.

On the upper of the second protuberance structure 710, the concave portion disposed on the inner surface of an elongate protrusion 751 can engage with the convex portion disposed on the outer surface of an elongate protrusion 391, and the concave portion disposed on the inner surface of an elongate protrusion 741 can engage with the convex portion disposed on the outer surface of an elongate protrusion 392.

On the lower of the second protuberance structure 710, the concave portion disposed on the inner surface of an elongate protrusion 732 engages with the convex portion disposed on the outer surface of an elongate protrusion 384, and the concave portion disposed on the inner surface of an elongate protrusion 720 engages with the convex portion disposed on the outer surface of an elongate protrusion 381.

The outer surface of an engagement portion 810 of the upper mounting clip 800 can engage with the inner surface of tab 331 which may be disposed on the elongate protrusion 353 on the upper of the second protuberance structure 710 such that the mounting clip 800 may be in a locked state. The outer surface of the engagement portion 810' of the lower mounting clip 800' can engage with the inner surface of tab 332 which may be disposed on the elongate protrusion 362 on the lower of the second protuberance structure 710 such that the mounting clip 800' can be in a locked state.

The legs 804 and 805 of the upper mounting clip 800 may engage with sides of hexagonal protrusion 703 or even disengage with sides of hexagonal protrusion 703. Both leg 804 and leg 805 can be disposed below the central diagonal of hexagonal protrusion 703. Flexible prongs 801 and 802 may be connected with the legs 804 and 805 work in non-deformation state. If a user wants to detach the display module 120 from the intelligent electronic device 110, an appropriate upward external force may be exerted to pull the upper mounting clip 800 such as the leg 804 and the leg 805 cross the central diagonal of the hexagonal protrusion 703.

The legs 804' and 805' of lower mounting clip 800 may engage with sides of the hexagonal protrusion 702 or may even disengage with sides of the hexagonal protrusion 702. Both the leg 804' and the leg 805' can be disposed above the central diagonal of the hexagonal protrusion 702. Flexible prongs 801' and 802' connected with the legs 804' and 805' work in non-deformation state. If a user wants to detach the display module 120 from the intelligent electronic device 110, an appropriate downward external force may be exerted to pull a lower mounting clip 800' such that the leg 804' and the leg 805' cross the central diagonal of the hexagonal protrusion 702.

The periphery of the second protuberance structure 710 may be substantially octagonal. The periphery of the first protuberance structure 301 may also be substantially octagonal.

Figure 13:
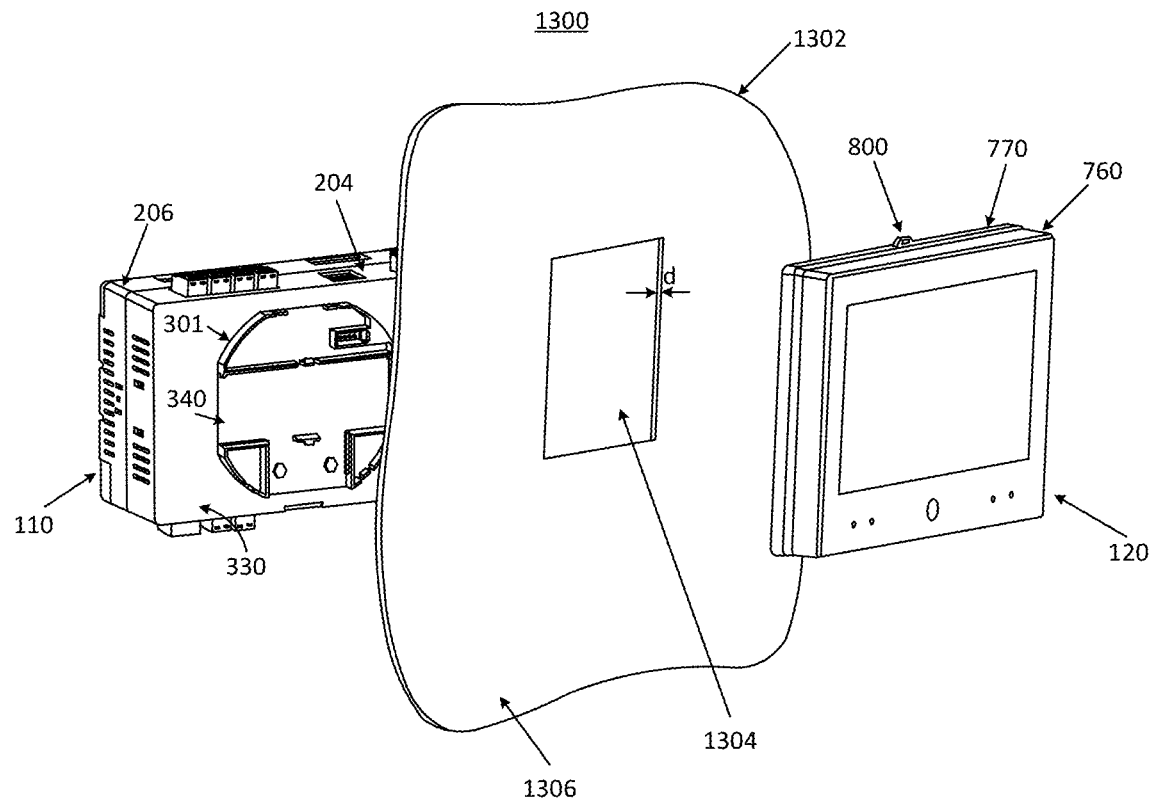
FIG. 13 is an exploded perspective front view of an intelligent electronic device shown in FIG. 11 illustrating how a display module is installed through the panel door of an enclosure.

FIG. 13 is an exploded perspective front of view of intelligent electronic device 110 in a panel mount configuration with a display module shown in FIG. 11 showing how the display module 120 that can be installed through a panel door of an enclosure.

The intelligent electronic device 110 can be configured to be mounted on a door panel 1302 with a thickness d through a cut-out 1304. The outer surface 340 of the first protuberance structure 301 may be higher than the outer surface 330 of rear housing 204. The height difference between an outer surface 340 and an outer surface 330 may be of thickness d of a door panel 1302. When intelligent electronic device 110 can be installed on the door panel 1302, the outer surface 340 of the first protuberance structure 301 may be in the same plane as the outer surface 1306 of the door panel 1302.

In the illustrative embodiment, the cut-out 1304 may be square, however the cut-out may be round in some instances. Since the periphery of the first protuberance structure 301 may be substantially octagonal, the first protuberance structure 301 can be adapted to be mounted on a door panel 1302 with a square or round cut-out.

Embodiments of the teachings of the present disclosure have been described in an illustrative manner. It is to be understood that the terminology that has been used is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. An intelligent electronic device for measuring a characteristic of electricity, comprising:
   a housing of the intelligent electronic device having a front and a rear, the housing defining an interior volume and including therein a sensor configured to sense the characteristic of electricity;
   a first protuberance structure disposed on a first outer surface of the housing;
   elongate protrusions and at least one hexagonal protrusion of the first protuberance structure comprised on a second outer surface of the first protuberance structure;
   the first protuberance structure is connected to a DIN rail or a display module;

the elongate protrusions include upper protrusions, lower protrusions, and a space between the upper protrusions and the lower protrusions;

the lower protrusions include left protrusions and right protrusions disposed on a left side and a right side of the at least one hexagonal protrusion;

a mounting clip installed on the first protuberance structure, adapted to move between an unlocked position and a locked position with an external force along the at least one hexagonal protrusion, and including at least one engagement portion, wherein the at least one engagement portion engages with a lower flange of the DIN rail when the mounting clip is disposed on the locked position, and disengages with the lower flange of the DIN rail when the mounting clip is disposed on the unlocked position;

wherein at least one tab is disposed on the upper protrusions extending into the space which is adapted to engage with an upper flange of the DIN rail;

wherein the mounting clip includes at least one opening below the at least one engagement portion; and wherein the mounting clip further comprises two flexible prongs extending upward into one of the at least one opening and the two flexible prongs are substantially parallel to the second outer surface.

2. The device of claim 1, wherein the space is adapted to accommodate the DIN rail.

3. The device of claim 1, wherein a leg is disposed on the top of each prong and extends inwards and the leg is substantially perpendicular to the second outer surface.

4. The device of claim 3, wherein the legs of the two flexible prongs are adapted to move along the opposite sides of one of the at least one hexagonal protrusion.

5. The device of claim 4, wherein the distance between the legs of the two flexible prongs in non-deformation state is less than the length of the central diagonal of one of the at least one hexagonal protrusion.

6. The device of claim 5, wherein a first tab extending downward into one of the at least one opening from the top of the at least one opening is disposed above the two left flexible prongs, the first tab engages with the top of one of the at least one hexagonal protrusion when the mounting clip is disposed on the unlocked position.

7. The device of claim 6, wherein a first opening is disposed on the bottom of the mounting clip which is adapted to pull or push the mounting clip.

8. The device of claim 7, wherein the periphery of the first protuberance structure is substantially octagonal.

9. The device of claim 8, wherein the outer surface of the first elongate protrusions along the periphery is adapted to connect with the display module.

10. The device of claim 9, wherein at least one elongate protrusion of the first elongate protrusions along the periphery has an aperture on either side thereof.

11. The device of claim 10, wherein a convex portion is disposed on the outer surface of the at least one elongate protrusion, the convex portion is adapted to engage with the corresponding concave portion disposed on the display module.

12. The device of claim 1, wherein the second outer surface of the first protuberance structure is higher than the first outer surface of the housing.

13. The device of claim 12, wherein the height difference between the second outer surface and the first outer surface is equal to the thickness of a door panel used in a panel configuration.

14. The device of claim 1, wherein a first housing of the display module includes a first front and a first rear;

the first rear of the first housing includes a second protuberance structure disposed on the third outer surface thereof, the second protuberance structure comprises first elongate protrusions, an upper hexagonal protrusion, and a lower hexagonal protrusion, disposed on the third outer surface of the first rear;

wherein a first periphery formed by the first elongate protrusions is adapted to engage with the intelligent electronic device;

the lower hexagonal protrusion is adapted to co-work with a lower mounting clip to secure the display module to the intelligent electronic device; and the higher hexagonal protrusion is adapted to co-work with a higher mounting clip to secure the display module to the intelligent electronic device.

15. The device of claim 14, wherein the first periphery is substantially octagonal.

16. The device of claim 14, wherein the first elongate protrusions include at least one lateral elongate protrusion that spans across left portion and right portion of the first perimeter.

17. The device of claim 14, wherein at least one first elongate protrusion of the first elongate protrusions along the perimeter is adjacent to an aperture on each side thereof.

18. The device of claim 17, wherein a concave portion is disposed on the inner surface of the at least one first elongate protrusion, the concave portion is adapted to engage with the corresponding convex portion of the intelligent electronic device.

19. The device of claim 14, wherein the upper protrusions include a first protrusion which has two adjacent apertures each on either side of the first protrusion, the first protrusion has a first tab extending upward, the upper mounting clip is adapted to engage with the first tab.

20. The device of claim 14, wherein the lower protrusions include a second protrusion which has two adjacent apertures each on either side of second protrusion, the second protrusion has second tab extending downward, the lower mounting clip is adapted to engage with the second tab.

21. The device of claim 1, wherein the first protuberance structure further includes a display connector on the second outer surface configured to receive a corresponding connector of the display module.

22. An intelligent electronic device assembly comprising:
a mounting clip with two sliding members;
an upper mounting clip and a lower mounting clip with one sliding member;
the intelligent electronic device comprising a housing having a front and a rear;
the housing defines an interior volume and including therein a sensor configured to sense a characteristic of electricity;
the rear of the housing includes a first protuberance structure disposed on a first outer surface thereof, wherein an outer surface of the first protuberance structure contains elongate protrusions, a left hexagonal protrusion, and a right hexagonal protrusion;
the first protuberance structure is connected to a DIN rail or a display module; the elongate protrusions include upper protrusions, lower protrusions, and a space formed therebetween;
the lower protrusions include left protrusions, right protrusions, and disposed therebetween at least one of the hexagonal protrusions;

the mounting clip with two sliding members adapted to co-work with the left hexagonal protrusion; and the right hexagonal protrusion for configuring the intelligent electronic device in a DIN rail mount configuration;

the display module having a first housing including a first front and a first rear, wherein a second protuberance structure is disposed on an outer surface of the first rear of the first housing, the second protuberance structure comprises first elongate protrusions, an upper hexagonal protrusion, and a lower hexagonal protrusion, disposed on the outer surface of the first rear, wherein a first periphery formed by the first elongate protrusions is adapted to engage with the intelligent electronic device;

the lower hexagonal protrusion is adapted to co-work with a lower mounting clip and a sliding member for configuring the intelligent electronic device in a panel mount configuration; and the higher hexagonal protrusion is adapted to co-work with a higher mounting clip and a sliding member for configuring the intelligent electronic device in the panel mount configuration.

* * * * *